(12) United States Patent
Driemel (10) Patent No.: US 9,144,170 B2
(45) Date of Patent: Sep. 22, 2015

(54) RETAINING CLIP FOR PLUGGABLE ELECTRONICS COMPONENTS

(75) Inventor: Daniel Driemel, Oederan (DE)

(73) Assignee: Siemens Aktiengesellschaft, München (DE)

( * ) Notice: Subject to any disclaimer, the term of this patent is extended or adjusted under 35 U.S.C. 154(b) by 697 days.

(21) Appl. No.: 13/465,026

(22) Filed: May 6, 2012

(65) Prior Publication Data

US 2012/0280689 A1 Nov. 8, 2012

(30) Foreign Application Priority Data

May 6, 2011 (DE) .......................... 10 2011 075 443

(51) Int. Cl.
*H05K 7/12* (2006.01)
*G01R 33/34* (2006.01)
*G01R 33/36* (2006.01)
*H05K 7/14* (2006.01)

(52) U.S. Cl.
CPC ............ *H05K 7/12* (2013.01); *G01R 33/34007* (2013.01); *G01R 33/3621* (2013.01); *H05K 7/142* (2013.01)

(58) Field of Classification Search
CPC ..................... G01R 33/3621; G01R 33/34007; H05K 7/12; H05K 7/142
See application file for complete search history.

(56) References Cited

U.S. PATENT DOCUMENTS 6,603,669 B2   8/2003   Sheen et al.
2005/0127914 A1   6/2005   Eberler et al.

FOREIGN PATENT DOCUMENTS

DE   103 53 341 A1   3/2005
DE   103 14 215 B4   11/2006

OTHER PUBLICATIONS

German Office Action dated Jan. 12, 2012 for corresponding German Patent Application No. DE 10 2011 075 443.1 with English translation.

*Primary Examiner* — Dixomara Vargas
(74) *Attorney, Agent, or Firm* — Lempia Summerfield Katz LLC (57) ABSTRACT

A local coil for a magnetic resonance tomography system includes a mainboard, at least one plug-in module that is connectable to the mainboard, and a clip engaging with the plug-in module and the mainboard. The clip is arranged at least partially at a side of the mainboard.

31 Claims, 6 Drawing Sheets

RETAINING CLIP FOR PLUGGABLE ELECTRONICS COMPONENTS

This application claims the benefit of DE 10 2011 075 443.1, filed on May 6, 2011.

BACKGROUND

The present embodiments relate to a magnetic resonance tomography (MRT) local coil for an MRT system.

Magnetic resonance tomography devices for examining objects or patients using magnetic resonance tomography (MRT, MRI, MR) are known, for example, from DE10314215B4.

In MR tomography, images having a high signal-to-noise ratio (SNR) may be acquired by local coil arrangements (e.g., loops, local coils). The local coil arrangements are antenna systems that are mounted in immediate proximity to (e.g., on (anterior) or under (posterior)) the patient. In the course of an MR measurement, the excited nuclei induce a voltage in the individual antennas of the local coil. The induced voltage is amplified by a low-noise preamplifier (e.g., LNA, preamp) and forwarded by a wired connection to the receive electronics. High-field systems (e.g., 1.5 T to 12 T and more) are employed, even in the case of high-resolution images, in order to improve the signal-to-noise ratio. If more individual antennas may be connected to an MR receiving system than there are receivers present, a switching array (e.g., an RCCS) may be installed between receive antennas and receivers. The switching array routes the currently active receive channels (e.g., the receive channels currently lying in the field of view of the magnet) to the receivers present. This enables more coil elements to be connected than there are receivers available, since in the case of whole-body coverage, only the coils that are currently located in the field of view (FoV) or in the homogeneity volume of the magnet of the MRT system may be read out.

The term "coil" (e.g., local coil) is used to refer to an antenna system that may include one antenna element (e.g., a coil element) or of a plurality of antenna elements (e.g., an array coil). Individual antenna elements may be implemented as loop antennas (e.g., loops) or as butterfly or saddle coils. A coil includes, for example, coil elements, one or more preamplifiers, further electronics (e.g., standing wave traps), cabling, a housing, and may include a cable with a plug-type connector, by which the coil is connected to the MRT system. The receiver (RX) mounted on the system side filters and digitizes the signal received by the local coil and passes the data to the digital signal processing device that may derive an image or a spectrum from the measurement. The digital signal processing device makes the image or the spectrum available to the user for diagnostic purposes.

Depending on the number of antenna elements, a local coil includes a different number of electronics modules. Forces in the MR system may act on the electronics modules, potentially causing the electronics modules (e.g., printed circuit boards (PCBs)) to be shaken loose if the PCBs are improperly anchored. For this reason, PCBs are adequately secured in local coils.

An arrangement of the electronics for an antenna element may include an electronics module (e.g., a mainboard), to which the antenna element is soldered and which may be populated on an element-specific basis.

Due to the soldered connections of the antenna and the frequently employed screwed anchorage to the coil housing, the mainboard is not replaceable without effort. Other PCBs (e.g., preamplifiers) may be plugged onto the mainboard. The pluggable components are the same for all the antenna elements and are to be pulled and inserted in order to balance the antenna element. Due to electrical function of the pluggable components, the pluggable components may be more susceptible to faults than the mainboard and consequently may need to be replaced more frequently. The pluggable components are connected electrically and mechanically (e.g., insertion force of the contacts) to the mainboard by way of plug-in contacts (e.g., female and male multipoint connectors). Because of the weight of the pluggable components and the installation position in the respective local coil, the pluggable components may work loose during operation due to the effect of forces introduced by the MR system. In other words, the insertion force of the connector parts may be insufficient as a mechanical fastening, and an additional securing device may be installed.

Figure 1:
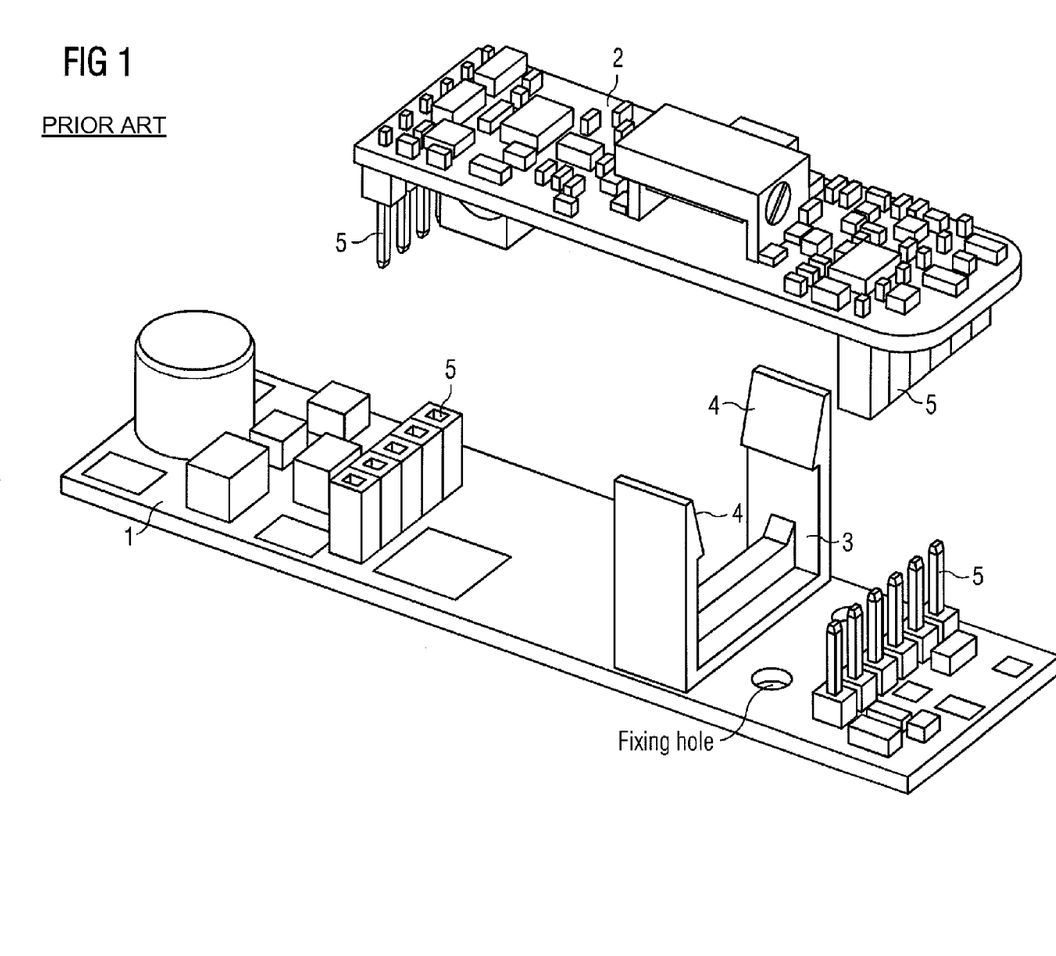
FIG. 1 shows a perspective view of a prior art mainboard of a local coil and a prior art printed circuit board that is to be plugged onto the mainboard.
Figure 2:
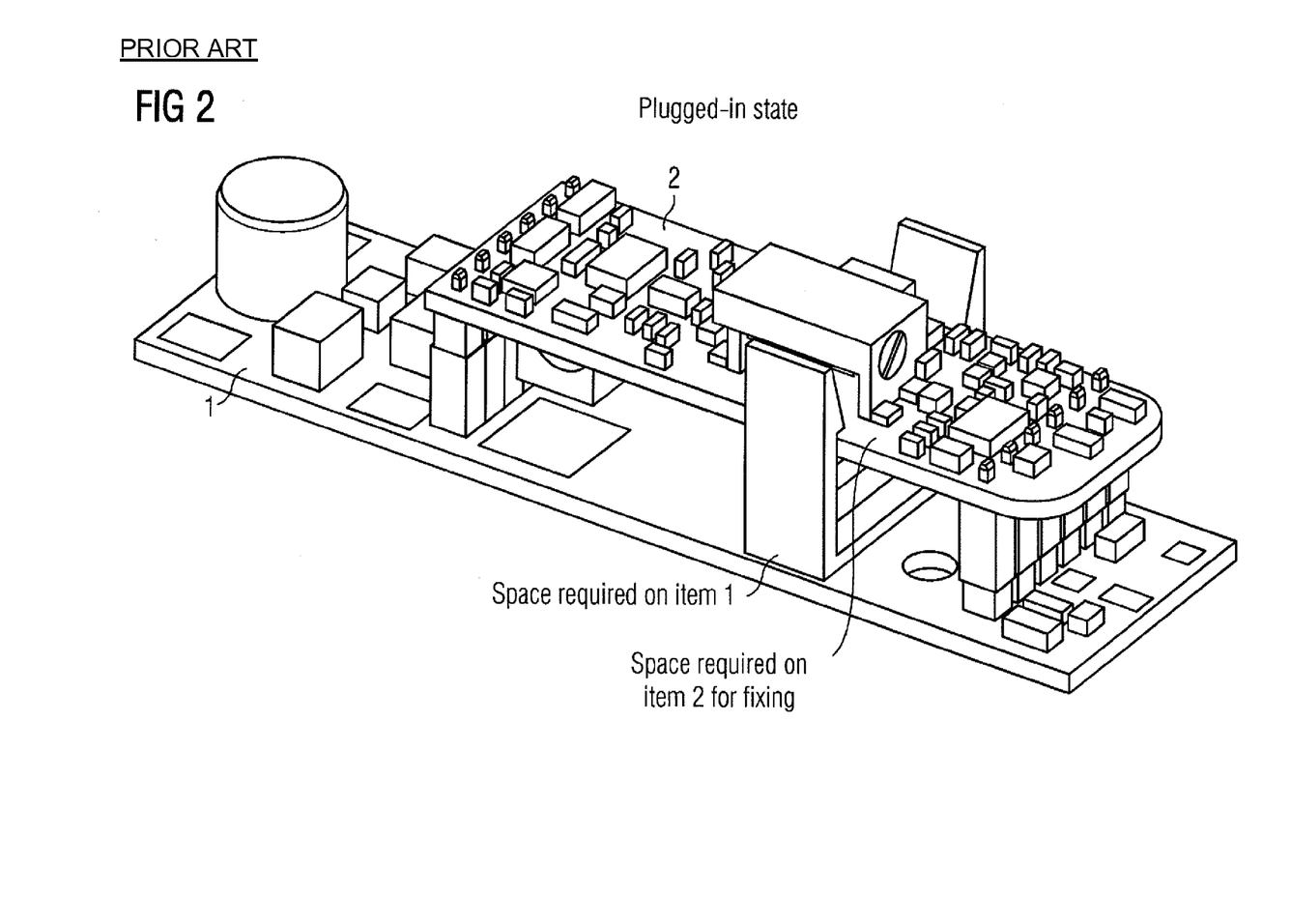
FIG. 2 shows a perspective view of a prior art mainboard of a local coil and a prior art printed circuit board that is plugged onto the mainboard and secured by a clip.

FIGS. 1 and 2 show a prior art solution.

A mainboard 1 is secured to the coil housing by a screwed connection.

A preamplifier 2 (e.g., an inserted component) is plugged onto the mainboard 1. A retaining clip 3 (also referred to hereinbelow as a bracket or retaining bracket) is snapped into place in the mainboard 1 and secures the inserted component 2 using snap-fit hooks 4. The plug-in parts 5 used possess an insertion depth of at least 5 mm.

SUMMARY

The present embodiments may obviate one or more of the drawbacks or limitations in the related art. For example, a magnetic resonance tomography local coil is optimized.

The present embodiments enable an alternative structure to conventionally used coils.

DETAILED DESCRIPTION OF THE DRAWINGS

Figure 6:
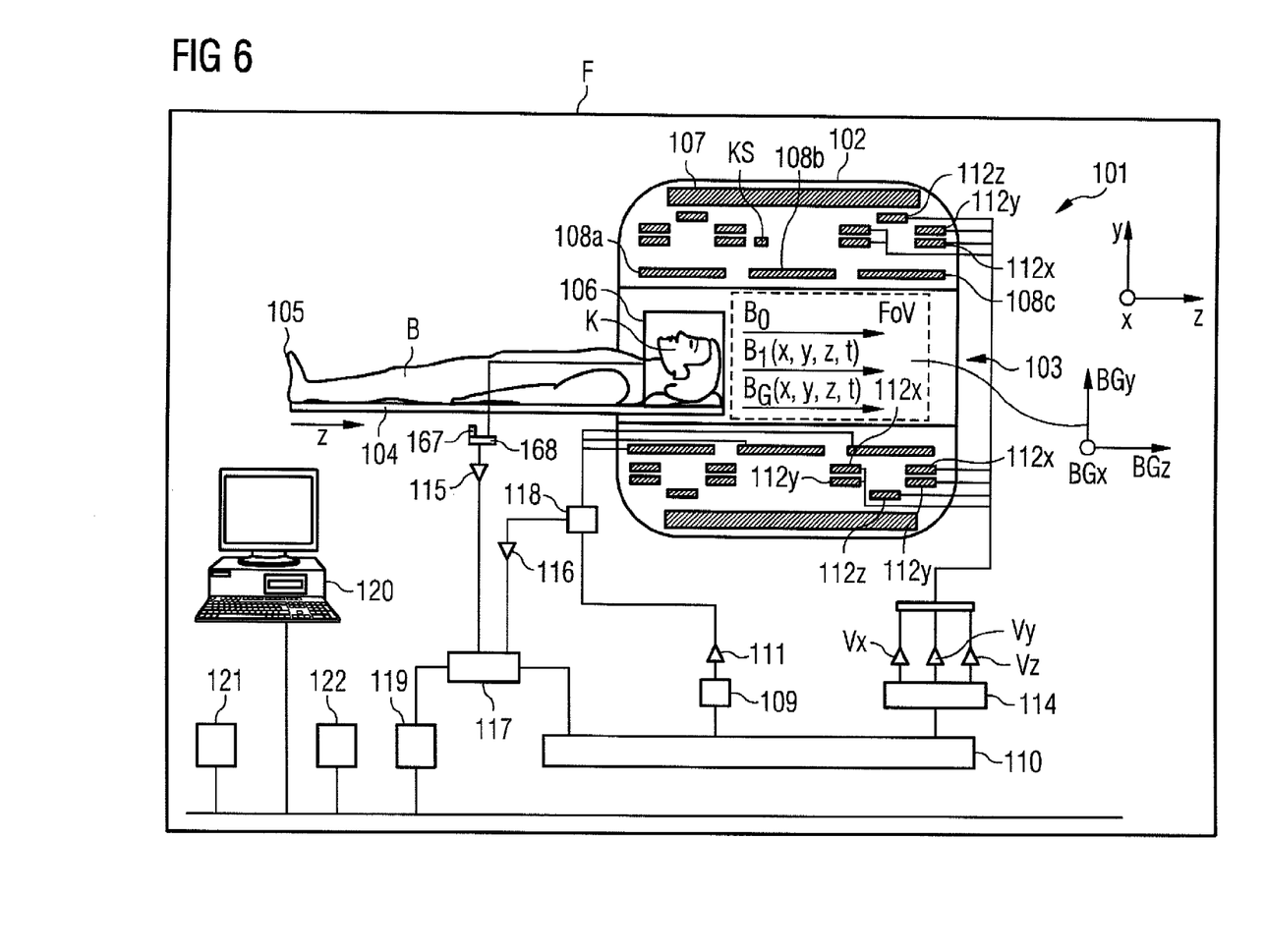
FIG. 6 shows a schematic view of one embodiment of an MRT system.

FIG. 6 shows an imaging magnetic resonance device MRT 101 (e.g., contained in a shielded room or Faraday cage F) including a whole-body coil 102 having, for example, a tubular bore 103, into which a patient couch 104 bearing a body 105 (e.g., of an examination object such as a patient; with or without local coil arrangement 106) may be introduced in the direction of the arrow z so that images of the patient 105 may be generated by an imaging method. Disposed on the patient, for example, is a local coil arrangement 106 (e.g., head coil or a head-neck coil), using which, in a local area (e.g., a field of view (FOV)) of the MRT, images of a sub-region (e.g., K) of the body 105 may be generated in the FOV. Signals of the local coil arrangement 106 may be evaluated (e.g., converted into images, stored or displayed) by an evaluation device (e.g., elements 168, 115, 117, 119, 120, 121) of the MRT 101 that may be connected to the local coil arrangement 106 (e.g., via coaxial cable or wirelessly via element 167).

When a magnetic resonance device MRT 101 is used to examine a body 105 (e.g., an examination object or a patient) using magnetic resonance imaging, different magnetic fields that are coordinated with one another with precision in terms of temporal and spatial characteristics are radiated onto the body 105. A strong magnet (e.g., a cryomagnet 107) in a measurement chamber having, for example, a tunnel-shaped bore 103 generates a strong static main magnetic field $B_0$ ranging, for example, from 0.2 Tesla to 3 Tesla or more. A body 105 that is to be examined, supported on a patient couch 104 is moved into a region of the main magnetic field $B_0$ that is approximately homogeneous in the area of observation (e.g., the FoV). The nuclear spins of atomic nuclei of the body 105 are excited by way of magnetic radio-frequency excitation pulses B1(x, y, z, t) that are emitted via a radio-frequency antenna (and/or a local coil arrangement, if necessary). The radio-frequency antenna is depicted in simplified form as a body coil 108 (e.g., a multipart coil 108a, 108b, 108c). Radio-frequency excitation pulses are generated, for example, by a pulse generation unit 109 that is controlled by a pulse sequence control unit 110. Following amplification by a radio-frequency amplifier 111, the pulses are directed to the radio-frequency antenna 108. The radio-frequency system shown in FIG. 6 is indicated only schematically. In some embodiments, more than one pulse generation unit 109, more than one radio-frequency amplifier 111 and a plurality of radio-frequency antennas 108 a, b, c are used in a magnetic resonance device 101.

The magnetic resonance device 101 also has gradient coils 112x, 112y, 112z, using which magnetic gradient fields are radiated in the course of a measurement in order to provoke selective layer excitation and for spatial encoding of the measurement signal. The gradient coils 112x, 112y, 112z are controlled by a gradient coil control unit 114 that, like the pulse generation unit 109, is connected to the pulse sequence control unit 110.

Signals transmitted by the excited nuclear spins (the atomic nuclei in the examination object) are received by the body coil 108 and/or at least one local coil arrangement 106, amplified by associated radio-frequency preamplifiers 116/ 115, and processed further and digitized by a receiving unit 117. The recorded measurement data is digitized and stored in the form of complex numeric values in a k-space matrix. An associated MR image may be reconstructed from the value-filled k-space matrix using a multidimensional Fourier transform.

In the case of a coil that may be operated both in the transmit and in the receive mode such as, for example, the body coil 108 or a local coil 106, correct signal forwarding is controlled by an upstream-connected duplexer 118.

From the measurement data, an image processing unit 119 generates an image that is displayed to a user via an operator console 120 and/or stored in a memory unit 121. A central computer unit 122 controls the individual system components.

In MR tomography, images having a high signal-to-noise ratio (SNR) may be acquired by local coil arrangements (e.g., loops, local coils). These are antenna systems that are mounted in immediate proximity to (e.g., on (anterior), under (posterior) or in) the body 105. In the course of an MR measurement, the excited nuclei induce a voltage in the individual antennas of the local coil. The induced voltage is amplified by a low-noise preamplifier (e.g., LNA, preamp) and forwarded to the receive electronics. High-field systems (e.g., 1.5 T and more) are employed, even in the case of high-resolution images, in order to improve the signal-to-noise ratio. If more individual antennas may be connected to an MR receiving system than there are receivers present, for example, a switching array (e.g., an RCCS) is installed between receive antennas and receivers. The switching array routes the currently active receive channels (e.g., the receive channels currently lying in the FoV of the magnet) to the receivers present. This enables more coil elements to be connected than there are receivers available, since in the case of whole-body coverage, only necessary the coils that are located in the FoV or in the homogeneity volume of the magnet may be read out.

The term local coil arrangement 106 may describe, for example, an antenna system that includes one antenna element or a plurality of antenna elements (e.g., coil elements) configured as an array coil. The individual antenna elements are implemented, for example, as loop antennas (e.g., loops) or as butterfly or saddle coils. A local coil arrangement includes, for example, coil elements, a preamplifier, further electronics (e.g., standing wave traps), a housing, supports, and a cable with a plug-type connector, by which the local coil arrangement is connected to the MRT system. A receiver 168 mounted on the system side filters and digitizes a signal received, for example, wirelessly by a local coil 106 and passes the data to a digital signal processing device. The digital signal processing device may derive an image or a spectrum from the data acquired by a measurement and makes the image or spectrum available to the user, for example, for subsequent diagnosis by the user and/or for storage in a memory.

Some advantageous features of exemplary embodiments of MRT local coils according to the present embodiments are described in greater detail below with reference to FIGS. 3-5.

Figure 3:
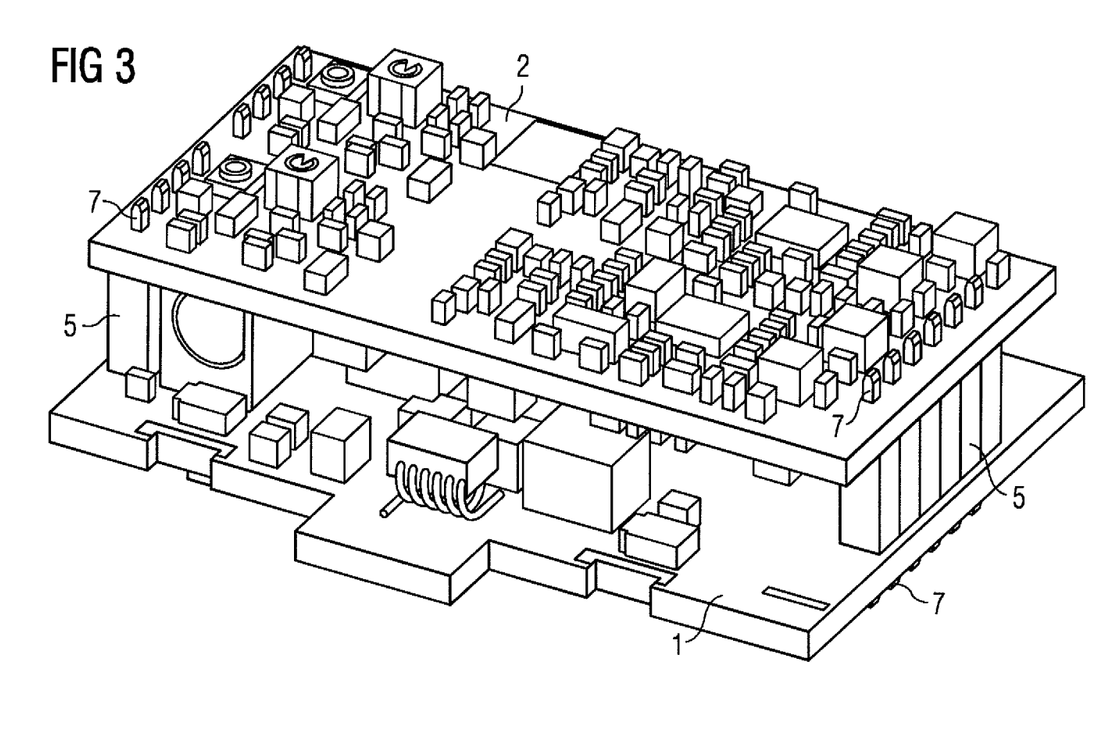
FIG. 3 shows a perspective view of one embodiment of a mainboard of a local coil and a printed circuit board that is plugged onto the mainboard.
Figure 4:
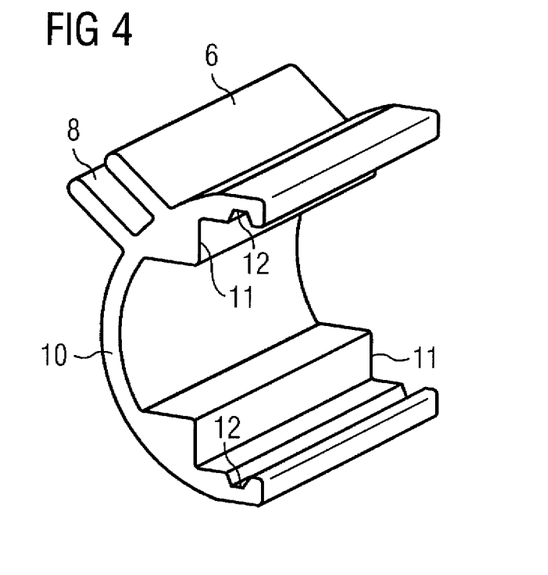
FIG. 4 shows a perspective view of one embodiment of a clip for securing a printed circuit board to a mainboard, onto which a printed circuit board may be plugged.
Figure 5:
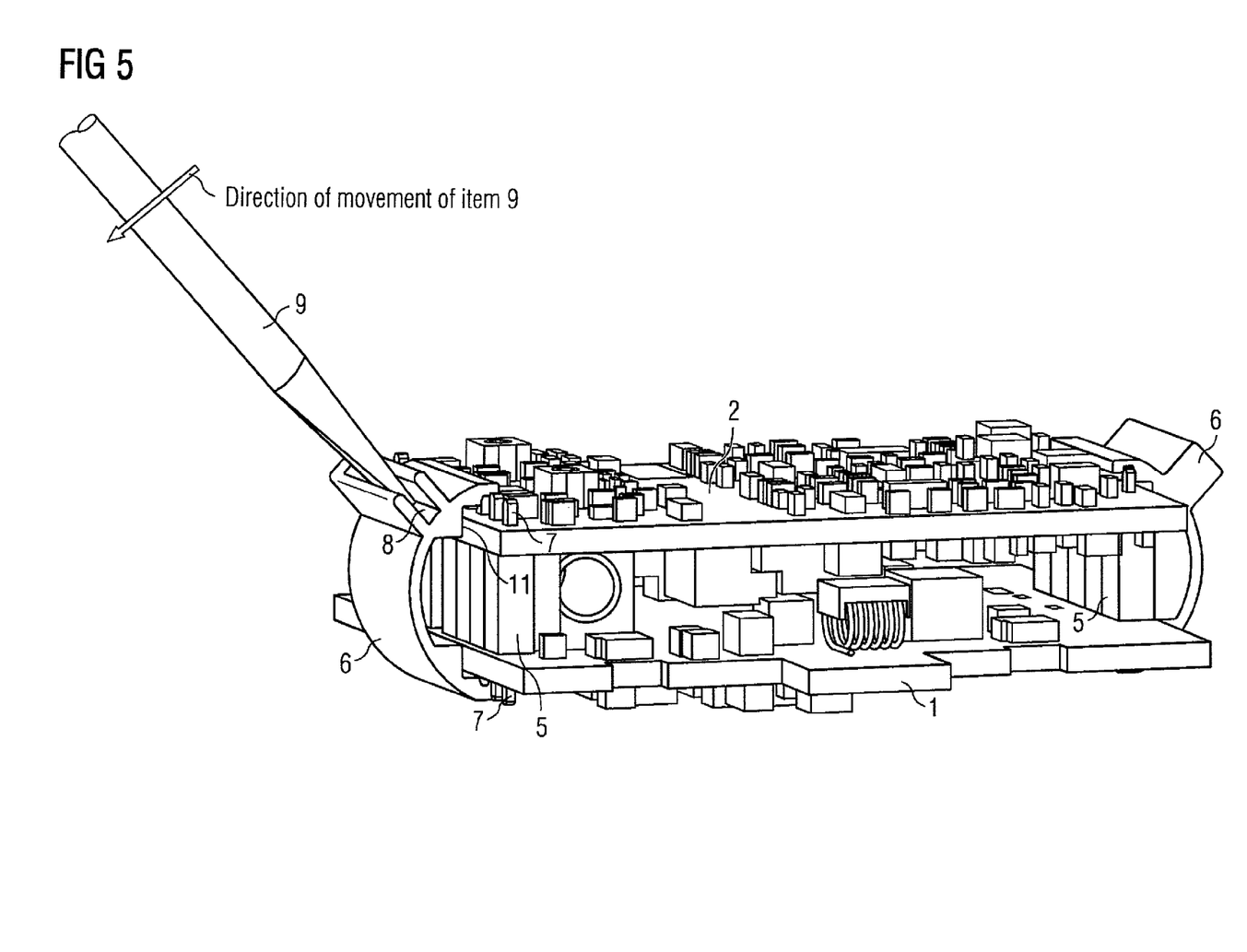
FIG. 5 shows a perspective view of one embodiment of a mainboard of a local coil, a printed circuit board plugged onto the mainboard and secured by a clip, and a tool for levering off the clip from the mainboard and the printed circuit board.

FIGS. 3, 4 and 5 show elements of an MRT local coil 106 including a mainboard 1, a plug-in module 2, and a retaining clip 6.

The mainboard 1 (also referred to hereinbelow as an electronics module) is mechanically connected (e.g., secured by screws) to or in a coil (outer) housing of an MRT local coil 106. Electronics (e.g., including a preamplifier that may preamplify signals received from an examination object in the local coil) of the local coil 106 may be arranged on the mainboard 1 and/or on one or more plug-in module(s) 2 mounted thereon.

At least one plug-in module 2 (also referred to hereinbelow as a plug-in component or electronics component) is connected (e.g., mechanically connected) to the mainboard 1 or fixed to the mainboard 1 (e.g., plugged onto the mainboard 1). The plug-in module 2 is secured to the mainboard 1 so as to protect the plug-in module 2, for example, against vibrations and/or displacement.

FIGS. 3, 4 and 5 show, as an exemplary embodiment, a resilient clip 6 that securely joins together the mainboard 1 (also referred to hereinbelow as a main circuit board or circuit board) and the plug-in module 2 by engaging with the plug-in module 2 and the mainboard 1 (e.g., contacting mainboard 1 and the plug-in module 2 with a pretensioning force and holding mainboard 1 and the plug-in module 2 against each other). The clip 6 is arranged at least partially at a side of the mainboard 1.

A curve 10 of the clip 6 allows tolerance compensation and pretensioning. By a groove 12 provided on the clip 6, solder pins 7 of connector parts 5 projecting through the printed circuit boards (e.g., the mainboard 1 and the plug-in module 2) as anchoring points are used.

In an initial position, the clip 6 (e.g., curve) is narrower than in an installed state. After attachment (e.g., to the mainboard 1 and the plug-in module 2), the clip 6 possesses a clamping force. The clip is mounted directly on the plug-in parts 5, thereby preventing rocking. The clip 6 is not attached until after testing of the local coil has been completed. A stop edge 11 (e.g., as a stop for the clip 6 against the printed circuit board 1) prevents the solder pins 7 from being snapped over and prevents possible damage being caused to the components on the printed circuit boards as a result. The clip 6 also includes a slot 8, into which, for example, a flat-blade screwdriver 9 may engage in order to release the clip 6 (e.g., from the mainboard 1 and the plug-in module 2) by tilting.

The clip 6 enables a precise, play-free fixing of pluggable components 2 even at shorter insertion depths (e.g., usable contact length).

Other potential advantages are that the curved design of the clip 6 allows pretensioning and enables a permanent clamping action to be realized after engagement. The components are pressed together and have no play.

Tolerance compensation of the components to be clamped is present as a result of the deformability of the clip.

The clip requires no or little space on the mainboard (e.g., area minimization).

A snap-fit engagement in the groove is achieved by way of the projecting solder pins present, and no additional snap-fit area is required (e.g. free edge region).

Lateral displacement of the clip 6 after engagement is prevented in that the pretensioning causes the ends of the solder pins to press into the plastic (e.g., of the clip; inherent slip resistance).

The side attachment is consequently possible not just in one position, but may be varied according to the length of the plug-in parts 5.

The clip is independent of the width of the electronics component 2 because the clip does not make use of the printed circuit board contours as an anchoring means.

The stop edge 11 prevents the clip from snapping-on over the solder pins and causing damage to the components.

The clip 6 is fastened in position only after all required testing-related insertion operations have been completed. This may save on repeated releasing and engagement actions.

The clip may be manipulated easily and conveniently by tilting using a flat-blade screwdriver.

The clip may, for example, include plastic materials (such as POM, PA, PP and others, for example) or contain only such materials.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil comprising:
    an antenna element in which a voltage is induced; and
    electronics to amplify the induced voltage, the electronics comprising a mainboard and a plug-in module that is connectable to the mainboard; and
    a clip engaging with the at least one plug-in module and the mainboard,
    wherein the clip is arranged at least partially at a side of the mainboard.

2. The local coil as claimed in claim 1, wherein the clip is arranged at the side outside of the mainboard.

3. The local coil as claimed in claim 1, wherein the clip is mounted onto the mainboard, and the plug-in module is mounted on the mainboard.

4. The local coil as claimed in claim 1, wherein the clip secures the plug-in module on the mainboard to protect against vibrations, displacement relative to the mainboard, or a combination thereof.

5. The local coil as claimed in claim 1, wherein the clip is located at the side of the mainboard in a plane defined by the mainboard or a greatest surface of the mainboard.

6. The local coil as claimed in claim 1, wherein the clip is arranged at the side of the mainboard except for sections of the clip engaging with the mainboard.

7. The local coil as claimed in claim 1, wherein in an installed state, the clip is arranged partially or substantially at a side of the plug-in module.

8. The local coil as claimed in claim 1, wherein the clip is arranged at a side of the plug-in module except for sections of the clip engaging with the plug-in module.

9. The local coil as claimed in claim 1, wherein in a state, in which the clip is arranged on the mainboard and the plug-in module, the clip is located at least partially at the side of the mainboard.

10. The local coil as claimed in claim 1, wherein the clip is arranged at the side of the mainboard in a plane defined by the greatest surface area of the mainboard outside of verticals on the plane.

11. The local coil as claimed in claim 1, wherein provision is made for a side attachment of the clip to the mainboard and the plug-in module in more than one position.

12. The local coil as claimed in claim 1, wherein the clip is made completely or partly of a resilient material.

13. The local coil as claimed in claim 1, wherein the clip is completely or partly curve-shaped.

14. The local coil as claimed in claim 1, wherein the clip has a resiliently deformable curve in order to allow tolerance compensation.

15. The local coil as claimed in claim 1, wherein in a state, in which the clip is not arranged on the mainboard and the plug-in module, the clip is narrower, shorter, or a combination thereof than in a state in which the clip is arranged on the mainboard and the plug-in module.

16. The local coil as claimed in claim 1, wherein the clip has a curve-shaped section that, in a state of the clip, in which the clip is arranged on the mainboard and the plug-in module, possesses a mechanical pretensioning force.

17. The local coil as claimed in claim 1, wherein the clip has one groove or a plurality of grooves that, in a state of the clip, in which the clip is arranged on the mainboard and the plug-in module, engage with solder pins of connector parts projecting through the mainboard and the plug-in module as anchoring points.

18. The local coil as claimed in claim 17, wherein in a state, in which the clip is arranged on the mainboard and the plug-in module, the clip is mounted directly on the connector parts.

19. The local coil as claimed in claim 1, wherein a stop edge is provided on the clip, and
    wherein, in a state of the clip, in which the clip is arranged on the mainboard and the plug-in module, the stop edge abuts the mainboard.

20. The local coil as claimed in claim 1, wherein the plug-in module is a printed circuit board.

21. The local coil as claimed in claim 1, wherein the clip has a recess, into which a tool is engageable in order to release the clip arranged on the mainboard and on the plug-in module from the mainboard and the plug-in module.

22. The local coil as claimed in claim 1, wherein in a state of the clip, in which the clip is arranged on the mainboard and the plug-in module, the mainboard and the plug-in module are pressed together by a mechanical pretensioning force of the clip.

23. The local coil as claimed in claim 22, wherein a snap-fit engagement in a groove is provided by way of solder pins projecting through the mainboard or the plug-in module.

24. The local coil as claimed in claim 23, wherein in a state of the clip, in which the clip is arranged on the mainboard and the plug-in module, ends of the solder pins are pressed into plastic of the clip as a result of the pretensioning force.

25. The local coil as claimed in claim 1, wherein the at least one plug-in module has a preamplifier.

26. The local coil as claimed in claim 1, wherein at least some coil electronics of the local coil is arranged on the mainboard.

27. The local coil as claimed in claim 1, wherein the plug-in module is a printed circuit board.

28. The local coil as claimed in claim 12, wherein the clip is made completely or partly of plastic.

29. The local coil as claimed in claim 21, wherein the recess is a slot.

30. The local coil as claimed in claim 21, wherein the tool is a flat-blade screwdriver.

31. The local coil as claimed in claim 23, wherein the snap-fit engagement in the groove is provided without an additional snap-fit area.

* * * * *